United States Patent [19]

Commander et al.

[11] Patent Number: 4,748,532
[45] Date of Patent: May 31, 1988

[54] TRANSFORMER COUPLED POWER SWITCHING CIRCUIT

[75] Inventors: Robert D. Commander, Twyford; Brian P. Fenton, Romsey; John G. Ramage, Chandlers Ford, all of England

[73] Assignee: International Business Machines Corporation, Armonk, N.Y.

[21] Appl. No.: 25,914

[22] Filed: May 6, 1987

Related U.S. Application Data

[63] Continuation of Ser. No. 706,377, Feb. 27, 1985, abandoned.

[30] Foreign Application Priority Data

Feb. 29, 1984 [EP] European Pat. Off. ........ 84301319.4

[51] Int. Cl.⁴ .................... H02H 7/122; H02M 3/335
[52] U.S. Cl. ......................................... 361/31; 363/58;
  363/98; 323/289
[58] Field of Search .................. 307/270; 363/56, 58,
  363/98; 323/289; 361/18, 30, 31

[56] References Cited

U.S. PATENT DOCUMENTS

| | | | |
|---|---|---|---|
| 3,805,094 | 4/1974 | Orlando | 307/300 |
| 3,820,008 | 6/1974 | Guarnaschelli | 323/17 |
| 4,270,164 | 5/1981 | Wyman et al. | 363/56 |
| 4,527,228 | 7/1985 | Chi Yu | 363/98 |
| 4,584,635 | 4/1986 | MacInnis et al. | 63/56 X |
| 4,586,119 | 4/1986 | Sutton | 363/17 |

FOREIGN PATENT DOCUMENTS

| | | |
|---|---|---|
| 0053208 | 6/1982 | European Pat. Off. . |
| 899135 | 6/1962 | United Kingdom . |
| 2110493 | 6/1983 | United Kingdom . |
| 2117144 | 10/1983 | United Kingdom . |

OTHER PUBLICATIONS

Elektrotecnische Zeitschrift, "GTO-Thyristoren in selbstgefuhrten stromrichtern", Heuman et al. vol. 104 (1983) p.328.
Electronics, "Modulating the Flyback Inverter Reduces Supply's Bulk", Brunstein, Aug. 2, 1979, p. 119.

*Primary Examiner*—A. D. Pellinen
*Assistant Examiner*—H. L. Williams
*Attorney, Agent, or Firm*—Robert W. Lahtinen

[57] ABSTRACT

A power switching circuit for switching power repetitively to a load at a relatively low frequency employs a power switching device which is driven across an isolating transformer interface. The drive signals are high frequency pulse signals which are modulated with the low frequency switching information, the modulations being detected in the secondary circuit of the transformer. Such an arrangement affords isolated driving with fast switching edges and requires only a small transformer. Power for the detection circuit is derived by rectification of the high frequency signals induced in the transformer secondary.

9 Claims, 4 Drawing Sheets

TRANSFORMER COUPLED POWER SWITCHING CIRCUIT

This is a continuation of application Ser. No. 706,377, filed Feb. 27, 1985 now abandoned.

TECHNICAL FIELD OF THE INVENTION

The invention relates to power switching circuits.

BACKGROUND OF THE INVENTION

Bridge or chopper circuits are frequently employed in applications such as motor drivers and switched-mode power supplies. In such circuits, high currents are switched repeatedly to an output filter or load by means of power switching devices, such as thyristors or power transistors, which are controlled by the application of suitable drive signals to their control electrodes. The d.c. power supply for such circuits is commonly derived by rectifying line voltage with no intervening transformer.

The drive signals for the power switching devices are, in turn, derived from switching logic signals generated by switching control logic. Such logic signals, even if of suitable form, are not normally applied directly to the power switching devices because the control logic is normally part of circuitry referenced to ground and isolated from the local line voltage. Accordingly, they, or drive signals derived from them, are usually applied via an isolated interface, such as an opto-isolator or a transformer.

One example of the use of an opto-isolator is described in U.S. Pat. No. 4,401,933 which shows a half bridge circuit for driving a single phase induction motor. Switching logic signals are applied via an opto-isolator to amplifiers which provide turn-on base drive signals alternately to the pair of series-connected power transistors forming the half bridge. The switching logic is thus isolated from the power switching devices. The amplifiers, however, are on the power side of the isolating interface, and must be provided with independent floating power supplies connected to the appropriate transistor emitter in order to be able to switch the power transistors correctly, since the d.c. supply to the transistors is floating.

One example of a transformer coupled arrangement for supplying power to a load is shown in U.S. Pat. No. 3,820,008 in which the current through a switching transistor, connected across an unregulated floating supply, is pulse width modulated and filtered to provide a regulated supply to the load. The current flowing in the primary circuit of a pulse transformer is modulated in response to control logic signals. The induced current in the secondary thus provides isolated base drive current to the power switching transistor which is unaffected by changes in the collector and emitter potentials of the switching transistor due to the floating nature of the supply.

In the case of this and other switched-mode power supplies, the frequency of modulation is commonly of the order of tens of kHz. At such frequencies relatively small transformers can be used and relatively fast switching can be achieved although auxiliary transformer windings may also be employed to speed up the switching or improve the modulation waveforms.

In the case of a motor driver, however, the switching frequencies required are considerably lower and are typically of the order of fifty to a few hundred Hz. Transformers with sufficiently large magnetising inductance to accommodate the lowest drive frequencies (50 Hz) and with sufficiently small leakage inductance to provide fast switching edges do not exist, yet fast switching is essential to avoid excessive transient power dissipation in the power switching transistors as they turn on and off.

DISCLOSURE OF THE INVENTION

The prior art has therefore failed to provide a transformer coupled power switching circuit capable of operating at relatively low frequencies. Accordingly, the present invention provides a power switching circuit for switching power repetitively to a load, comprising a power switching device responsive to a drive signal at a control input thereof to connect a power supply to a load and a drive circuit for providing a repetitive drive signal to the control input of the power switching device within a predetermined frequency range, the drive circuit comprising a transformer and a primary circuit including a primary winding of the transformer, a source of periodic signals of frequency above said predetermined frequency range, modulating means for producing from said periodic signals a signal modulated at a frequency within said predetermined range and means for applying the modulated signal to the primary winding, the drive circuit further comprising a secondary circuit including a secondary winding of the transformer, in which a correspondingly modulated signal is induced, and detecting means for detecting the modulations and producing in response thereto such a repetitive drive signal for application to the control input of the power switching device.

Thus, by employing modulation of a high frequency waveform to indicate the switching points for the power switching device, the primary circuit may be isolated from the power supply to the switching device and, at the same time, a small enough transformer may be employed to give relatively fast switching edges. Typically, the high frequency waveform would be several orders of magnitude higher than the switching frequency.

If the power supply to the load is floating, the detecting means must have its own floating supply in order to be able to control the switching of the power device correctly. This can be achieved according to a preferred feature of the invention by providing the secondary circuit with rectifying means for rectifying the modulated secondary winding signal, the rectified signal being connected to provide an independent power supply to the detecting means.

In order to ensure correct functioning of the detection means, it is further preferred that the secondary circuit include inhibiting means for inhibiting the detection means from producing the repetitive drive signal if the independent power supply voltage from the rectifying means is below a predetermined minimum.

Although, other techniques such as frequency modulation can be contemplated, the preferred method of modulation is by inversion of an asymmetric waveform applied to the primary winding, whose voltage excursions are asymmetric about a mean level. Such a waveform can be produced within the modulating means by combination of an oscillator pulse train with switching logic signals to produce gating signals which are then applied to a bridge circuit. The bridge circuit produces a modulated signal whose cyclic voltage excursions comprise pulses of one sense, amplitude and duration alternating with pulses of the opposite sense, a lower amplitude and a proportionately increased duration.

This form of modulation facilitates detection of the switching points by amplitude comparison in which the voltage excursions of the modulated signal induced in the secondary circuit are compared with at least one predetermined threshold. The threshold is exceeded by the induced signal in only one of its two possible states.

Preferably both an upper threshold and a lower threshold are employed, so that, when the secondary signal exceeds the upper threshold a bistable device is set to one of its two states and when the secondary signal falls below the lower threshold, the bistable is set to the other of its states. The output of the bistable constitutes the repetitive drive signal to the power switching device.

When the power supply to the detecting means is provided by rectification of the secondary signal, the upper and lower thresholds would be referenced to the rectified power supply voltage.

Another preferred feature of circuits according to the invention is a current sensing means for sensing the current flow through the power switching device across an isolated interface. A timer means responsive to the sensed current exceeding a reference value switches off the power switching device for a predetermined interval. Thus the current through the device is chopped to keep it within safety limits. Isolation of the sensing means is necessary for the same reasons as given above in connection with the drive circuits.

In order that direct currents, for example in the supply line of a bridge network of power switching devices can be sensed, it is preferred that the current sensing means comprises a transformer whose secondary circuit includes a secondary winding connected in parallel with a resistor through which the current to be sensed is arranged to flow and a diode arranged in series with the secondary winding to prevent current flow from the power switching device therethrough. The primary circuit includes a primary winding, a controllable current source responsive to signals from the periodic signal source to apply current pulses to the primary winding. In this way the diode is forward biassed so that the voltage across the resistor is applied to the secondary winding to induce a proportionate voltage across the primary winding. This primary voltage, which represents the current flowing through the resistor, is stored on a charge storage device.

BRIEF DESCRIPTION OF THE DRAWINGS

The invention will now be described, by way of example, with reference to the following drawings, in which.

DETAILED DESCRIPTION OF THE INVENTION

Figure 1:
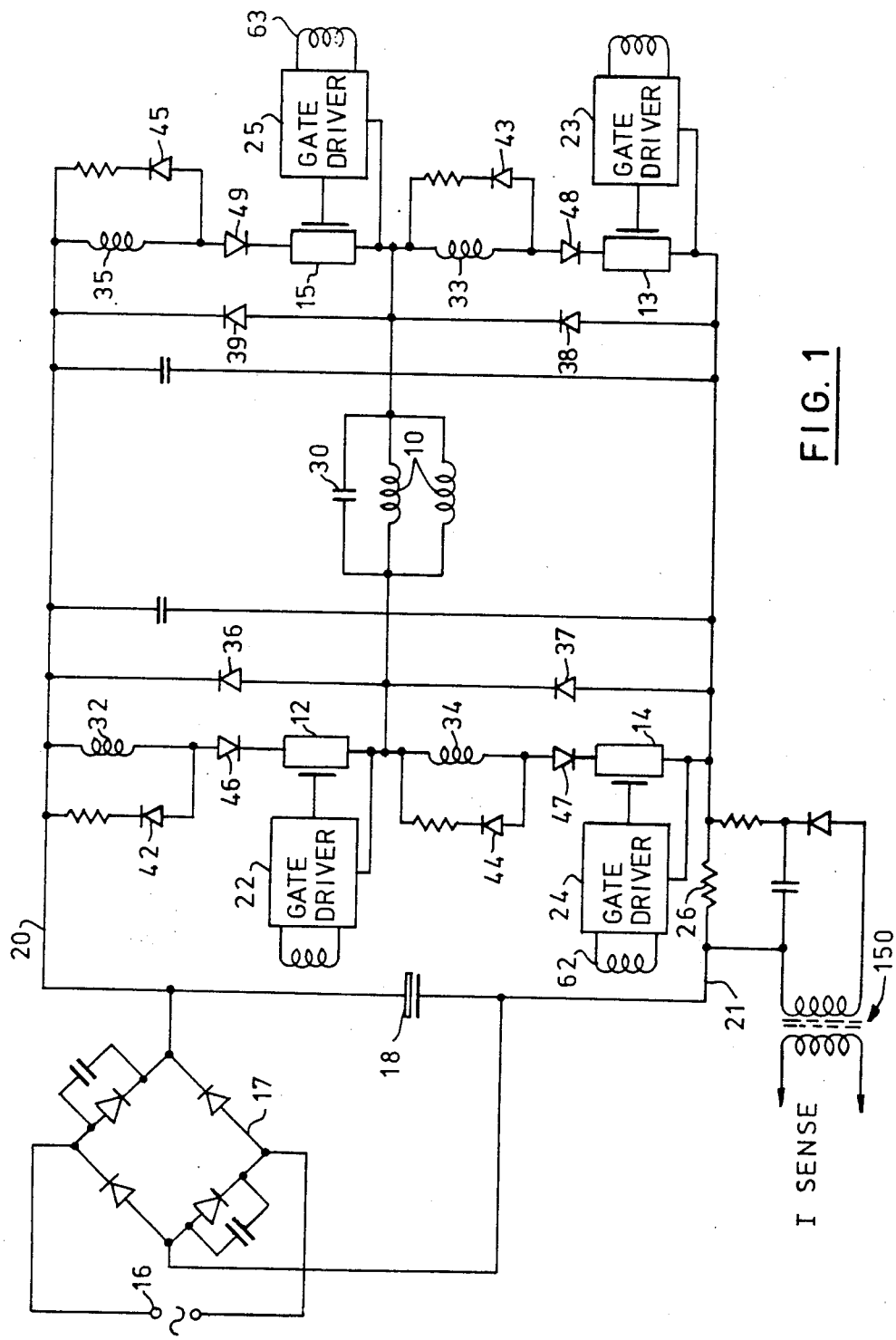
FIG. 1 is a circuit diagram of a motor bridge driver circuit employing power switching devices.

FIG. 1 shows a bridge driver circuit for driving the split run winding 10 of a single phase induction motor. The winding is connected in a 'H' bridge arrangement between four N-channel metal oxide semiconductor field effect transistors (Mosfets) 12-15 which are capable of carrying currents of several amps.

An unregulated and floating direct voltage power supply to the bridge is generated from the a.c. mains supply 16 by diode bridge 17. The voltage from the diode bridge is smoothed and stored on capacitor 18 and applied to the bridge on lines 20 and 21.

In operation, gate drive circuits 22-25 alternately switch on diagonally opposite pairs of Mosfets so that an alternating current flows through the bridge, firstly through transistors 12 and 13 then through transistors 15 and 14. The gate drive circuits, which are described in detail in FIG. 3, are themselves driven across a transformer isolated interface by shared primary drive circuits, described in detail in FIG. 2. The total current flowing through the bridge passes through a resistor 26 which is part of an isolated current sensing network illustrated in FIG. 4.

The remaining components of the bridge act to protect the transistors 12-15 from transients and voltages above their rated level. Capacitor 30 shunts the run winding 10 and thus limits the rate of change of voltage across it. Series inductors 32-35 limit the rate of change of current through the transistors 12-15.

Flyback voltages across the various inductances in the circuit, arising from alternation or switching off of the bridge, could cause excessive voltages to be applied across transistors 12-15. These voltages are shunted away from the transistors by appropriately positioned diodes. When the bridge switches, the ends of run winding 10 are clamped by diodes 36-39 to the positive or negative supply rails, as necessary, thus preventing a voltage greater than supply voltage from being applied to the transistors 12-15. Further diodes 42-45 and associated resistors also prevent positive flyback voltages in inductors 32-35 from being applied to the transistors. The various paths provided by diodes 36-39 and 42-45 ensure that the voltages occurring at the sources and drains of transistors 12-15 can never exceed those of the supply. For example, diodes 44 and 36 clamp the drain of transistor 14 to the positive rail and diode 37 clamps the source of transistor 12 to the negative rail.

Diodes 46-49 prevent reverse currents through the transistors 12-15 which contain integral reverse shunt diodes and are susceptible to damage from stored charge associated with fast switch-off of these integral diodes.

Figure 3:
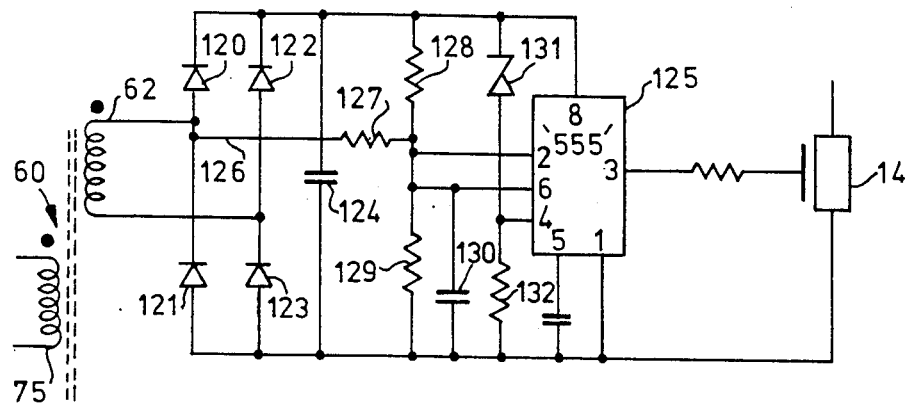
FIG. 3 is a circuit diagram of a transformer coupled gate drive circuit, forming the remaining portion of the power switching circuit partially illustrated in FIG. 2.
Figure 4:
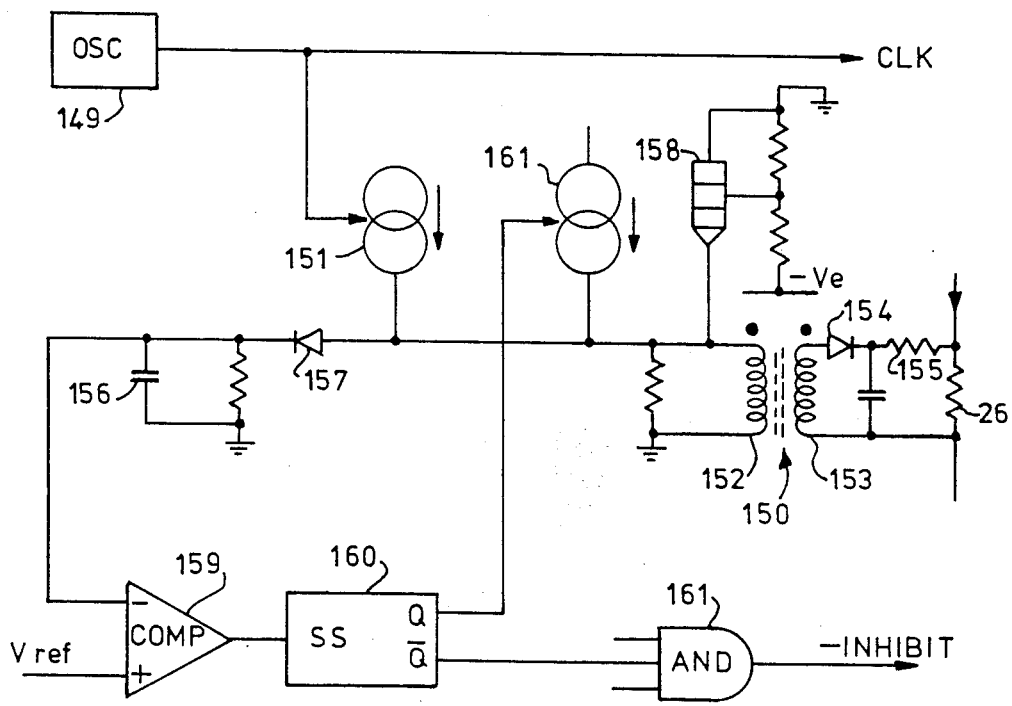
FIG. 4 shows a current sense and limit circuit employed in the bridge driver circuit of FIG. 1.

Having described, the operation of the bridge driver in general terms, in connection with FIG. 1, the primary and gate drivers will now be described with reference to FIGS. 2-4. Various waveforms occurring in the circuits of FIGS. 2-4 are illustrated in FIG. 5.

Figure 2:
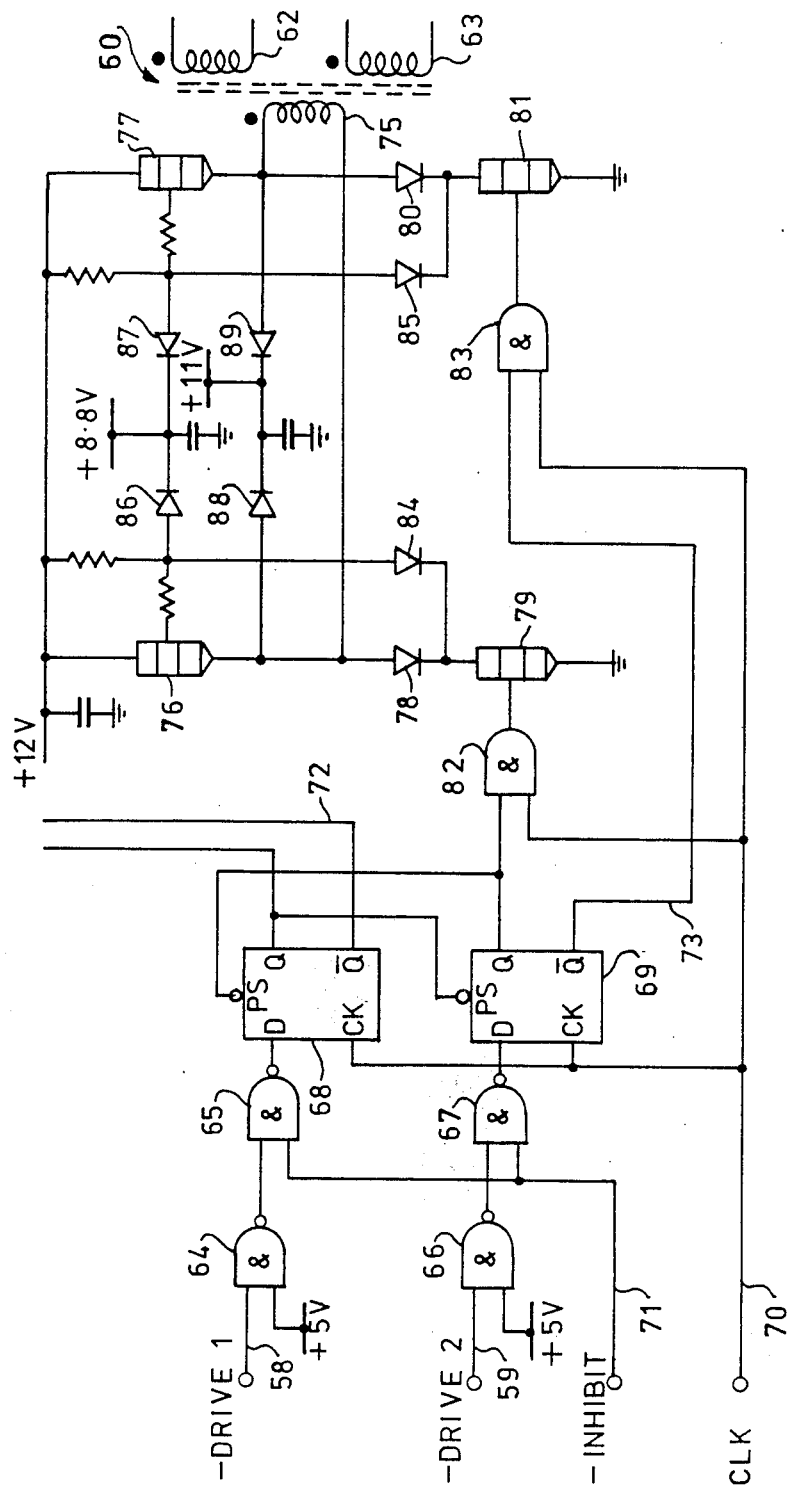
FIG. 2 is a circuit diagram of a primary drive circuit forming part of a power switching circuit according to the invention, for driving the power switching devices of FIG. 1.
Figure 5:
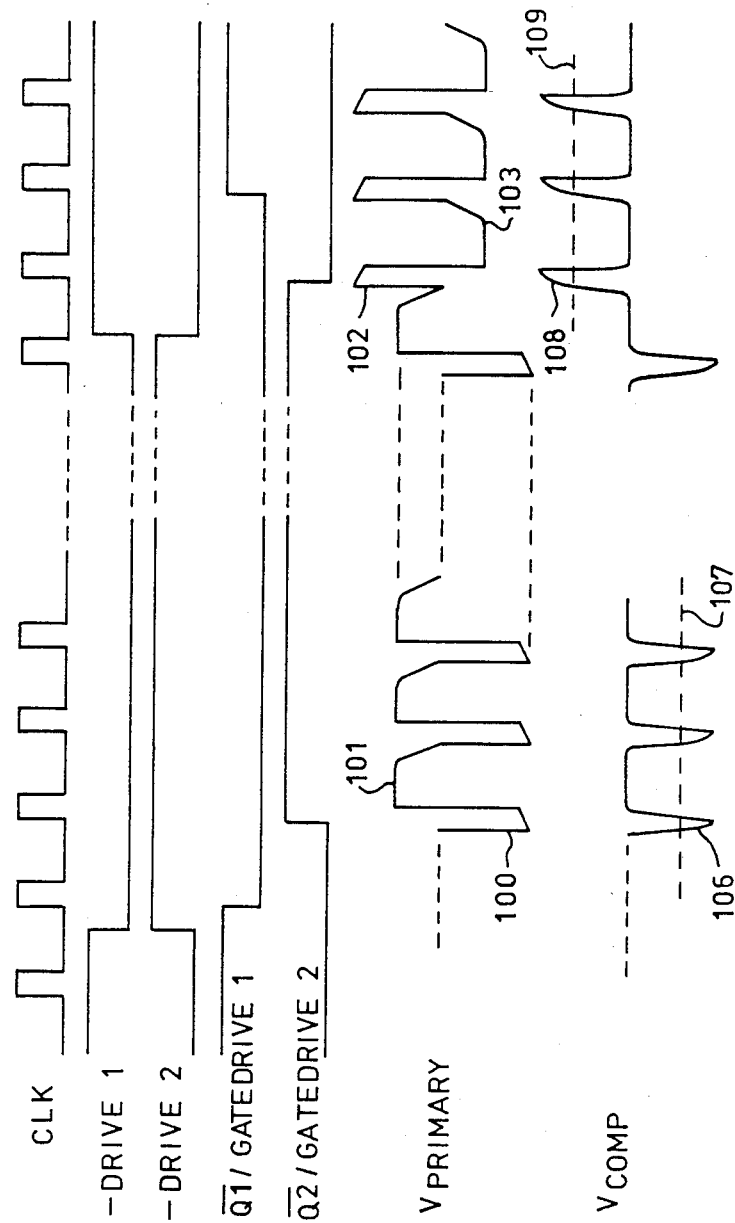
FIG. 5 shows various waveforms occurring in the circuits of FIGS. 1-4.

The basic signals controlling the operation of the bridge and, thus, the running of the motor are two logic signals—DRIVE 1 and—DRIVE 2 shown in FIG. 5 which are applied on input lines 58 and 59 of FIG. 2. These are complementary logic signals whose frequency may be varied to change the operating speed of the motor. They are produced by a motor controller in response to an input start command and continue until a stop command is received. A complete description of a suitable controller for producing the DRIVE logic signals is given in U.S. Pat. No. 4,401,933 and will not be repeated here. In the controller described in the referenced patent, the DRIVE signals are firstly produced at mains frequency (50/60 Hz) while the motor is started with mains assistance and are then ramped up in frequency to around 120 Hz, corresponding to the final operating speed of the motor.

As has been explained above such logic signals cannot be applied directly to the Mosfet gate electrodes of the switching bridge driver of FIG. 1 because of fluctuations of the power supply voltages in the bridge driver resulting from its direct connection to line voltage. The—DRIVE 1 and—DRIVE 2 signals are, therefore, applied to the primary driver circuits of two isolating transformers, one of which is shown generally at 60 in FIG. 2.

The two secondaries 62 and 63 of transformer 60 provide the input to one diagonal pair of gate drive circuits 24 and 25 (FIG. 1). A similar transformer and pair of secondaries (not shown) provide the input to the other pair of gate drive circuits, 22 and 23.

Since the frequency of the DRIVE signals is, typically, in the range of 50–120 Hz, very large transformers would be needed to pass such signals to the gate drive circuits of the bridge. Even then, the large leakage inductance of such transformers would prevent safe and effective operations of the bridge because the switching speeds achievable would be so low that excessive transient dissipation would occur in the power transistors.

The primary driver circuit is therefore arranged to receive a much higher frequency (50 KHz) pulse train "CLK" from an oscillator and to produce from it a waveform modulated in accordance with the level changes of the DRIVE signals. Because of the much higher frequency of this modulated signal a much smaller transformer 60 can be employed whose inductance need only be of the order of 3 mH and which can be packaged in a volume of less than 15 $cm^3$. The modulations can be detected in the secondary circuit of FIG. 3 to provide sharply switching gate drive signals to the appropriate pair of the transistors 12–15.

In order to prevent shorting of the series connected pairs of Mosfets across the supply, it is essential to build in a brief delay between the switching off of one Mosfet and the switching on of the Mosfet in series with it (eg 12 and 14). Such a delay is produced by logic in the primary driver circuit of FIG. 2 as follows. The DRI-VE—1 and—DRIVE 2 signals are applied on lines 58 and 59 via pairs of NAND gates 64, 65 and 66, 67 to a pair of "D-type" flip-flops 68 and 69 which are clocked by the pulses "CLK" on line 70. The effect of the NAND gates 64 and 66 is merely to invert the signals. In the absence of an "INHIBIT" condition on line 71, gates 65 and 67 alternate the state of their respective flip-flops 68 and 69 in response to the changes in state of the respective DRIVE signals to produce output signals Q and e,ovs/Q/ which are synchronised with the "CLK" pulses. However, cross coupling of the "Set" (Q) outputs of the flip-flops to their "Preset" (PS) inputs ensures that both can never be reset at the same time. The Q output waveforms from the two flip-flops are thus staggered by one clock pulse interval as shown by the waveforms $\overline{Q1}$ and $\overline{Q2}$ in FIG. 5. The waveforms $\overline{Q1}$ and $\overline{Q2}$ appear on lines 72 and 73 respectively. The delay between the "on" intervals of $\overline{Q1}$ and $\overline{Q2}$ is insignificant to the operation of the motor because the period of $\overline{Q1}$ and $\overline{Q2}$ is so much greater than that of the clock pulses.

The waveforms $\overline{Q1}$ and $\overline{Q2}$ represent the form of the actual drive signals GATE DRIVE 1 and GATE DRIVE 2 to be applied to the gates of the motor bridge transistor diagonal pairs after demodulation in the gate driver secondary circuits 22-25. If the—INHIBIT signal on line 71 falls, for example in response to the detection of excessive current in the motor bridge driver, gates 65 and 67 cause the flip-flops 68 and 69 to set with their Q outputs high. This has the effect of turning off the transistors in the motor bridge for the duration of the INHIBIT signal (100$\mu$S). In this way, a build up of excessive current in the bridge is avoided by chopping the current.

As has been stated above, the reset waveforms $\overline{Q1}$ and $\overline{Q2}$ actually represent the desired gate driving waveform to be applied to the transistors 12-15 of the motor bridge driver. In order, to pass such signals across the transformer 60 interface, they and the set waveforms Q1 and Q2 are employed to modulate a high frequency carrier waveform derived from the oscillator pulse train on line 70.

The signals $\overline{Q2}$ and Q2 flip-flop 69 are used to modulate the signal applied to the primary of transformer 60. This takes place in the remaining portion of the primary driver circuit of FIG. 2. This portion of the primary driver is another bridge circuit in which each end of the primary winding 75 can either be held at a fixed voltage by an emitter follower (transistors 76 and 77) or switched to ground through a series-connected diode and transistor pair (78, 79 or 80, 81). High frequency oscillator pulses from line 70 are provided by whichever of a pair of AND circuits, 82 or 83, is currently enabled by the Q2 and $\overline{Q2}$ signals, to one only of the ground switch transistors 79 and 81.

When one of these ground switch transistors, say 81, is pulsed on, the associated emitter follower 77 on the same end of the primary is turned off by a diode 85 between the emitter follower base and the ground switch. Current is drawn through the primary winding from the diagonally opposite transistor 76 and flows to ground through transistor 81. This current flow lasts for the duration of one of the oscillator pulses (5$\mu$S). The emitter voltage of transistor 76 is clamped to an 8.8 V supply line by diode 86. The voltage across the transistor $V_{PRIMARY}$ is a pulse of negative polarity, as shown at 100 in FIG. 5, whose amplitude is the difference between the clamping voltage and ground.

At the end of each oscillator pulse, the active ground switch transistor 81 turns off and the voltage across the primary reverses. The flyback voltage results in the dotted end of winding 75 going positive until clamped by a further diode 89 to an 11V supply line. The lower end of winding 75 remains clamped at the emitter voltage of transistor 76 so that the primary winding sees a positive voltage pulse as shown at 101 in FIG. 5. When all the primary current has decayed and the flyback voltage has collapsed, no more current will flow until the next oscillator pulse arrives.

The primary waveform is thus asymmetric in its voltage excursions about a mean level with the amplitudes of the voltage excursions being determined by 8.8 and 11 volt supplies and the clamping action of diodes 86-89. These two reference supply voltages are derived from an external Zener diode reference (not shown). In this way a fixed ratio is maintained between forward and flyback voltages across the primary.

When Q2 falls and $\overline{Q2}$ rises, the ground switch transistor 79 is pulsed "on" and a current pulse of the reverse (positive) polarity is drawn through transistor 77 as seen at 102 in FIG. 5. When the oscillator pulse CLK falls, the primary voltage flies back to produce a negative peak 103 of approximately half the amplitude of peak 102. Thus, an asymmetric high frequency signal is applied to the primary driver and is modulated by inversion every time the signal Q2 changes state.

An identical primary driver circuit (not shown) responds to the outputs Q1 and $\overline{Q1}$ of flip-flop 68 by producing a similarly modulated signal at the primary of another transformer (not shown) for providing the gate drive to transformers 22 and 23.

The voltage induced in the secondaries 62 and 63 of transformer 60 has the same waveform as that in the primary. The modulation of the waveform is detected in gate drive circuits 24 and 25 one of which, gate drive circuit 24, is illustrated in FIG. 3.

The gate drive circuit consists of a full wave rectifying arrangement of diodes 120-123. The rectified secondary waveform is smoothed by and stored a capacitor 124. This capacitor 124 provides an independent power supply to a comparator module 125 at terminals 1 and 8 thereof. This obviates the need for an external power supply and isolates the gate driver from the remaining circuitry.

The module 125 is in fact a commercially available timer module (eg Signetics type NE 555) although it is not used as timer in this case. Inputs 2 and 6 are negative setting and positive resetting inputs respectively. They are connected to internal comparators which compare the applied voltage with different respective negative going and positive going threshold voltages. These threshold voltages are set internally by a potentiometer at ⅓ and ⅔ of the supply voltage applied between terminals 1 and 8. Thus, the thresholds are referenced to the rectified secondary voltage. An internal latch is set and reset by the output of the two internal comparators to drive a totem pole output stage producing a square wave output at terminal 3.

In operation, the raw secondary waveform on line 126 is modified by resistor 127 and the effect of diodes 120-123 to produce the waveform $V_{COMP}$ shown in FIG. 5. $V_{COMP}$ is applied to both comparator inputs 2 and 6. The negative pulses 106, corresponding to pulses 100, fall below the lower threshold 107 and set the module 125. The positive pulses 108, corresponding to pulses 102, exceed the upper threshold 109 and reset the module. Thus, the module produces an output waveform of exactly the same form as the original logic waveform $\overline{Q2}$ which is applied as the signal GATE DRIVE 2 to the gate of the transistor 14 in the motor bridge driver.

During flyback periods between the secondary waveform peaks, the voltage $V_{COMP}$ at comparator inputs 2 and 6 is maintained at half the supply voltage stored on capacitor 124 by resistors 128 and 129. This is because the diodes 120-123 remain back biassed by the supply voltage on capacitor 124 and thus no current flows in resistor 127. Capacitor 130 inhibits any fast edges on the comparator inputs that may cause false switching.

Another feature of the gate drive circuit is the Zener diode 131 and resistor 132. These ensure that a reset input 4 to the module 125 is maintained active until the supply voltage across the module exceeds the Zener break-down voltage. In this way, faulty operation of the circuit before the capacitor 124 has fully charged, is prevented. Also uncontrolled turn-on is prevented if the oscillator pulses stop for some reason with the module 125 in its "set" condition.

It remains to describe the operation of the current sensing circuit of FIG. 4 which prevents overcurrent in the motor bridge driver. The total current flowing through the bridge passes, as d.c., through resistor 26 shown in both FIGS. 1 and 4. For similar reasons to those given in connection with the application of the primary drive, it is necessary to sense the current across an isolated interface provided, in this case, by transformer 150.

To sense direct current, high frequency pulses from a 1 mA current source 151 are applied to the primary winding 152 of the transformer. The source 151 is controlled by the 50 KHz output from the same oscillator 149 which also supplies the high frequency pulse train CLK to the primary driver of FIG. 2. The pulses are passed by the transformer to its secondary winding 153. The effect of the induced pulses in the secondary circuit is to forward bias a diode 154 and allow the sum of the diode drop, a very small voltage developed across a resistor 155 and the voltage developed across resistor 26 by the bridge current to be applied to the secondary winding. Normally, the diode is back biassed and no voltage is developed across the secondary winding.

The secondary voltage resulting from the forward biassing of diode 154 is reflected back to the primary winding 152 and charges a capacitor 156 via a diode 157. The voltage drop across diode 157 cancels that across diode 154 so that the net voltage on capacitor 156 is substantially equal to that across resistor 26. It therefore represents the current flowing in the bridge network.

When the current pulse from source 151 terminates, the flyback voltage across the primary winding is clamped to a safe negative level by transistor 158. If the sensed current through resistor 26 as represented by the voltage on capacitor 156 exceeds a predetermined threshold, V ref, then a comparator 159 triggers a single shot 160. The $\overline{Q}$ output of the single shot falls and causes the—INHIBIT signal from AND gate 161 to fall. This signal, it will be recalled, is applied to the primary driver circuit on line 71 of FIG. 2 and is used to switch off the active transistors of the bridge driver. The other inputs to AND 161 represent other conditions which may require the bridge driver to be switched off and need not be discussed.

When the transistors of the bridge are turned off, the voltage across the inductive load flies back through diodes 36-39 and the current through the sensing resistor 26 reverses. The large current which would flow through secondary winding 153 and diode 154 is limited by resistor 155. The flyback nevertheless applies a voltage to primary winding 152 which, if allowed to develop, would cause capacitor 156 to charge and comparator 159 to falsely indicate excess current at the end of the pulse from single shot 160 when the bridge transistors turn on again. To prevent this happening a second current source 161 is caused by the Q output of single shot 163 to inject 10mA into primary winding 152 for the duration of the shot pulse. This reverses the polarity of the voltage developed across the winding 152 during the off period so that it always flies back such that its primary voltage goes negative to ground when the current to the bridge is restored. Thus single shot 160 will not be falsely triggered by comparator 159.

The period of the single shot is 100μS which limits the chopping frequency of the driver to 5 KHz. It should be pointed out, however, that, in normal operation, the bridge driver should not exceed its current limit and the current limiting arrangement of FIG. 4 will not come into play.

We claim:

1. A power switching circuit for switching power repetitively to a load, comprising a power switching transistor responsive to a low frequency drive signal at a control input thereof to connect a power supply to a load for the duration of the drive signal, the low frequency lying within a predetermined range, and a drive circuit for providing such a drive signal to the control input of said power switching transistor, said drive circuit comprising a transformer and a primary circuit including a primary winding of said transformer, a source of high frequency periodic signals of frequency above said predetermined frequency range, amplitude modulating means arranged to produce from low frequency switching logic signals and said high frequency periodic signals a signal modulated at a frequency within said predetermined range in accordance with the switching logic signals and means for applying the modulated signal to said primary winding, the drive circuit further comprising a secondary circuit including a secondary winding of said transformer, in which a corresponding modulated signal is induced, amplitude detecting means for detecting the modulations by sensing non zero values and producing in response thereto such a low frequency drive signal for application to the control input of said power switching transistor, and rectifying means for rectifying the modulated secondary winding signal, the rectified signal being connected to provide an independent power supply to the detecting means.

2. A power switching circuit as in claim 1 in which the periodic waveform portions of the amplitude modulated signals from the modulating means exhibit cycle voltage excursions which are asymmetric about a mean level, the modulation being effected by inversion of said waveform portions.

3. A power switching circuit as in claim 2 in which the source of periodic signals is an oscillator capable of producing a train of pulses and said modulating means comprises gating logic responsive to pulses from said oscillator and also to said switching logic signals to produce gating signals, and a bridge circuit responsive to the gating signals from the gating logic to produce a modulated signal whose cyclic voltage excursions comprise pulses of one polarity, amplitude and direction alternating with pulses of the opposite polarity, a lower amplitude and a proportionately increased duration.

4. A power switching circuit as in claim 2 in which said detection means includes amplitude comparison means for comparing the voltage excursions of the modulated signal induced in the secondary circuit with at least one predetermined threshold such that the threshold is exceeded by the induced signal in only one of its inverted and non-inverted states.

5. A power switching circuit as in claim 4 in which said amplitude comparison means is arranged to compare the voltage excursions of a signal derived from the modulated secondary signal with an upper threshold and a lower threshold, said detection means further including a bistable device which is set to one of its states when the derived signal exceeds the upper threshold and is set to the other of its states when the derived signal falls below the lower threshold, the output of said bistable device constituting the repetitive drive signal.

6. A power switching circuit as in claim 1 including isolated current sensing means for sensing the current flow through said power switching transistor across an isolated interface and timer means responsive to the sensed current exceeding a reference value to switch off said power switching transistor for a predetermined interval.

7. A power switching circuit as in claim 6 in which said current sensing means comprises a second transformer whose secondary circuit includes a secondary winding connected in parallel with a resistor through which the current to be sensed is arranged to flow and a diode arranged in series with said secondary winding to prevent current flow from said power switching transistor therethrough, the second transformer primary circuit including a primary winding, a controllable current source, responsive to signals from said periodic signal source to apply current pulses to said second transformer primary finding whereby a diode is applied to said secondary winding to induce a proportionate voltage across said primary winding, the second transformer primary circuit further including a charge storage device for storing the induced primary voltage which represents the current flowing through said resistor.

8. A power switching circuit for switching power repetitively to a load, comprising a power switching transistor responsive to a low frequency drive signal at a control input thereof to connect a power supply to a load for the duration of the drive signal, the low frequency lying within a predetermined range, and a drive circuit for providing such a drive signal to the control input of said power switching transistor, said drive circuit comprising a transformer and a primary circuit including a primary winding of said transformer, a source of high frequency periodic signals of frequency above said predetermined frequency range, modulating means arranged to receive low frequency switching logic signals and said high frequency periodic signals and to produce an output signal comprising periodic wave form portions at a frequency above said predetermined range modulated at a frequency within said predetermined range in accordance with the switching logic signals and means for applying the modulated signal to said primary winding, the drive circuit further comprising a secondary circuit including a secondary winding of said transformer, in which a corresponding modulated signal is induced, detection means for detecting the modulations and producing in response thereto such a low frequency drive signal for application to the control input of said power switching transistor, rectifying means for rectifying the modulated secondary winding signal, the rectified signal being connected to provide an independent power supply to the detection means and inhibiting means for inhibiting said detection means from producing the repetitive drive signal if the independent power supply voltage from said rectifying means is below a predetermined minimum.

9. A power switching circuit for switching power repetitively to a load, comprising a power switching device responsive to a drive signal at a control input thereof to connect a power supply to a load, a drive circuit for providing a repetitive drive signal to the control input of said power switching device within a predetermined frequency range, an isolated current sensing means for sensing the current flowing through said power switching device across an isolated interface and timer means responsive to said sensed current exceeding a reference value to switch off said power switching device for a predetermined interval, said drive circuit comprising a transformer and a primary circuit including a primary winding of said transformer, a source of periodic signals of frequency above said predetermined frequency range, modulating means for producing from said periodic signals a signal modulated at a frequency within said predetermined range and means for applying the modulated signal to said primary winding, said drive circuit further comprising a secondary circuit including a secondary winding of said transformer, in which a corresponding modulated signal is induced, and detection means for detecting the modulations and producing in response thereto such a repetitive drive signal for application to said control input of said power switching device, said current sensing means comprising a second transformer whose secondary circuit includes a secondary winding connected in parallel with a resistor through which said current to be sensed is arranged to flow and a diode arranged in series with said second transformer secondary winding to prevent current flow from said power switching device therethrough said second transformer primary circuit including a primary winding, a controllable current source, responsive to signals from said periodic signal source to apply current pulses to said second transformer primary winding whereby said diode is forward biased so that the voltage across said resistor is applied to said second transformer secondary winding to induce a proportionate voltage across said primary winding, said primary circuit further including a charge storage device for storing said induced primary voltage which represents the current flowing through said resistor.

* * * * *